(12) United States Patent
Lee

(10) Patent No.: US 6,801,472 B2
(45) Date of Patent: Oct. 5, 2004

(54) RDLL CIRCUIT FOR AREA REDUCTION

(75) Inventor: Joong-Ho Lee, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 17 days.

(21) Appl. No.: 10/400,664

(22) Filed: Mar. 28, 2003

(65) Prior Publication Data

US 2003/0184355 A1 Oct. 2, 2003

(30) Foreign Application Priority Data

Mar. 28, 2002 (KR) ........................................ 2002-16961

(51) Int. Cl.[7] ................................................. G11C 8/00

(52) U.S. Cl. ........................................ 365/233; 365/194

(58) Field of Search ................................. 365/233, 194

(56) References Cited

U.S. PATENT DOCUMENTS 6,442,102 B1 * 8/2002 Borkenhagen et al. ...... 365/233
6,650,575 B1 * 11/2003 Khanna ...................... 365/194

* cited by examiner

Primary Examiner—Tan T. Nguyen
(74) Attorney, Agent, or Firm—Jacobson Holman PLLC

(57) ABSTRACT

A register-controlled delay locked loop (RDLL) circuit for area reduction, includes a first clock buffer for generating a falling clock signal, which is activated at a rising edge of an inverted external clock signal, a second clock buffer for generating a rising clock signal, which is activated at a rising edge of an external clock signal, a clock multiplexer for outputting a single clock signal made by combining the falling clock signal and the rising clock signal, a delay line for delaying the single clock signal to generate a delayed single clock signal, and a controller for controlling the delay line so as to adjust amount of delay of the single clock signal.

11 Claims, 5 Drawing Sheets

US 6,801,472 B2

RDLL CIRCUIT FOR AREA REDUCTION

FIELD OF THE INVENTION

The present invention relates to a register-controlled delay locked loop (RDLL) circuit; and, more particularly, to an RDLL circuit for reducing a chip area, which is used in a double data rate synchronous dynamic random access memory (DDR SDRAM).

DESCRIPTION OF RELATED ART

Recently, the most remarkable issue in a field of DRAM development is a synchronous DRAM (SDRAM) such as a double data rate SDRAM (DDR SDRAM) and a RAMBUS DRAM. It is expected that the synchronous DRAM will lead a memory market in the future since it can perform a high-speed operation compared to a general DRAM.

The delay locked loop (DLL) represents a circuit used to synchronize an internal clock of a synchronous memory device with an external clock without errors. That is, the DLL circuit is used to synchronize the internal clock with the external clock to control a timing delay, which occurs when the external clock is used in an internal circuit.

In FIG. 1, there is provided a block diagram of a conventional register-controlled delay locked loop (RDLL) circuit.

The RDLL circuit includes a first clock buffer 101 for generating a falling clock signal fclk2, which is actuated at a falling edge of an external clock signal CLK, based on an inverted external clock signal /CLK; a second clock buffer 102 for producing a rising clock signal rclkt2, which is activated at a rising edge of the external clock, based on the external clock signal CLK; a clock divider 103 for outputting one pulse signal per every 4 clocks based on the rising clock signal rclkt2; a first phase comparator 104 for comparing a reference signal ref from the clock divider 103 with a feedback signal feedback from a replica unit 117; a first shift controller 105 for generating a right shift signal SR__1, which controls a shift register to move to the right, by using an output of the first phase comparator 104; a first shift register 106 for adjusting an amount of delay by shifting its output signal to the right in response to the right shift signal SR__1 provided from the first shift controller 105; a first long delay line 107 for adjusting the amount of delay of the output signal of the first shift register 106 in response to an output signal delay__in of the clock divider 103; a second long delay line 108 for adjusting the amount of delay of the output signal of the first shift register 106 in response to the rising clock signal rclkt2; a third long delay line 109 for adjusting the amount of delay of the output signal of the first shift register 106 in response to the falling clock signal fclk2; a second phase comparator 110 for comparing the reference signal ref from the clock divider 103, the feedback signal feedback from the replica unit 117 and an output signal of the first shift controller 105; a second shift controller 111 for producing a left shift signal SL__s and a right shift signal SR__s, which are used to control a shift register to move to left and right, respectively, by using an output signal of the second phase comparator 110; a second shift register 112 for adjusting an amount of delay by shifting its output signal to left and right in response to the left shift signal SL__s and the right shift signal SR__s supplied from the second shift controller 111; a first short delay line 113 for adjusting the amount of delay of the output signal of the second shift register 112 in response to the output signal of the first long delay line 107; a second short delay line 114 for adjusting the amount of delay of the output signal of the second shift register 112 under the control of the output signal of the second long delay line 108; a third short delay line 115 for adjusting the amount of delay of the output signal of the second shift register 112 in response to the output signal of the third long delay line 109; a low-pass filter 116, which is actuated by a delay locked loop locking signal D11__lockz from the second shift controller 111, for counting times of result values outputted from the second phase comparator 110; the replica unit 117 for compensating a timing difference between the external clock and the internal clock by using a feedback delay signal fb__dly2 whose delay is adjusted from the first short delay line 113; and a DLL driving unit 118 for providing the output signals from the second and the third short delay lines 114 and 115 to an internal circuit.

The operation of the RDLL circuit in FIG. 1 will be briefly explained hereinafter.

The clock divider 113 generated the reference signal ref and the delay line input signal delay__in, which are activated for every 4 clocks, by receiving the rising clock signal rclkt2 provided from the outside. The reference signal ref is compared with the feedback signal feedback representing a modeling result of a time delay to be compensated through the replica unit 117. The delay line input signal delay__in is inputted to the first long delay line 107 and has a delay adjusted by the first shift register 106. The output signal of the first long delay line 107 is transferred via the second short delay line 113 and the replica unit 117, and then enables the feedback signal feedback.

The feedback signal feedback outputted from the replica unit 117 is compared with a rising edge of the reference signal ref at the first and the second phase comparator 104 and 110. Then, the first shift and the second shift controller 105 and 111 generate the right shift signals SR__1 and SR__s and the left shift signal SL__1, respectively, based on the compared results from the first and the second phase comparator 104 and 110.

In FIG. 2, there is described a block diagram of the delay lines 107 to 109 and 113 to 115 employed in the conventional RDLL circuit.

Each delay unit included in the conventional delay lines includes a first NAND gate 201 for performing a NAND operation based on a rising clock signal and the output signal of the shift register; a second NAND gate 202 for executing a NAND operation based on an output signal of the first NAND gate 201 and a first input signal; a first inverter 203 for inverting an output signal of the second NAND gate 202; a third NAND gate 204 for carrying out a NAND operation based on the rising clock signal and the output signal of the shift register; a fourth NAND gate 205 for performing a NAND operation based on an output signal of the third NAND gate 204 and an output signal of the first inverter 203; a second inverter 206 for inverting an output signal of the fourth NAND gate 205; a fifth NAND gate 207 for executing a NAND operation based on a falling clock signal and the output signal of the shift register; a sixth NAND gate 208 for carrying out a NAND operation based on an output signal of the fifth NAND gate 207 and the first input signal; a third inverter 209 for inverting an output signal of the sixth NAND gate 208; a seventh NAND gate 210 for performing a NAND operation based on the falling clock signal and the output signal of the shift register; an eight NAND gate 211 for executing a NAND operation based on an output signal f the seventh NAND gate 210 and an output signal of the third inverter 209; a fourth inverter 212 for inverting an output signal of the eight NAND gate 211; a ninth NAND gate 213 for carrying out a NAND operation based on a delay signal and the output signal of the shift register; a tenth NAND gate 214 for performing a NAND operation based on an output signal of the ninth NAND gate 213 and the first input signal; a fifth inverter 215 for inverting an output signal of the tenth NAND gate 214; an eleventh NAND gate 216 for executing a NAND operation based on the delay signal and the output signal of the shift register; a twelfth NAND gate 217 for carrying out a NAND operation based on an output signal of the eleventh NAND gate 216 and an output signal of the fifth inverter 215; and a sixth inverter 218 for inverting an output signal of the twelfth NAND gate 217.

Herein, the clock signal generated by the replica unit 117 and the delay line for the reference signal ref is delayed as much as the sum of the delays. Namely, when the reference signal ref corresponds to a rising edge of the output signal of the replica unit 117, the following equation EQ. 1 is satisfied.

$$D+R=2t,\ D=2T-R \qquad \text{EQ. 1}$$

wherein D is the amount of delay of the delay line; R represents the amount of delay of the replica unit 117; and T shows a period of the external clock.

Therefore, the clock signal outputted from the delay line has a negative delay being 'R' faster than the period of the external clock.

However, since the conventional RDLL circuit uses the delay line which occupies most of layout area of a DLL device, the chip size becomes bigger and, thus, it is difficult to design a portable DLL device. Furthermore, the current consumption is substantial because of the use of a lot of delay circuits.

SUMMARY OF THE INVENTION

It is, therefore, an object of the present invention to provide an RDLL circuit for area reduction by decreasing additional circuits of delay lines to reduce the layout area and the current consumption.

In accordance with an aspect of the present invention, there is provided a register-controlled delay locked loop (RDLL) circuit for area reduction, including: a first clock buffer for generating a falling clock signal, which is activated at a rising edge of an inverted external clock signal; a second clock buffer for generating a rising clock signal, which is activated at a rising edge of an external clock signal; a clock multiplexer for outputting a single clock signal made by combining the falling clock signal and the rising clock signal; a delay line for delaying the single clock signal to generate a delayed single clock signal; and a controller for controlling the delay line so as to adjust amount of delay of the single clock signal.

In accordance with another aspect of the present invention, there is provided a double data rate synchronous dynamic random access memory (DDR SDRAM) having a register-controlled delay locked loop (RDLL) for area reduction, the RDLL increasing: a first clock buffer for generating a falling clock signal, which is activated at a rising edge of an inverted external clock signal; a second clock buffer for generating a rising clock signal, which is activated at a rising edge of an external clock signal; a clock multiplexer for outputting a single clock signal made by combining the falling clock signal and the rising clock signal; a delay line for delaying the single clock signal to generate a delayed single clock signal; and a controller for controlling the delay line so as to adjust amount of delay of the single clock signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a RDLL circuit for area reduction in accordance with the present invention will be described in detail referring to the accompanying drawings.

Figure 1:
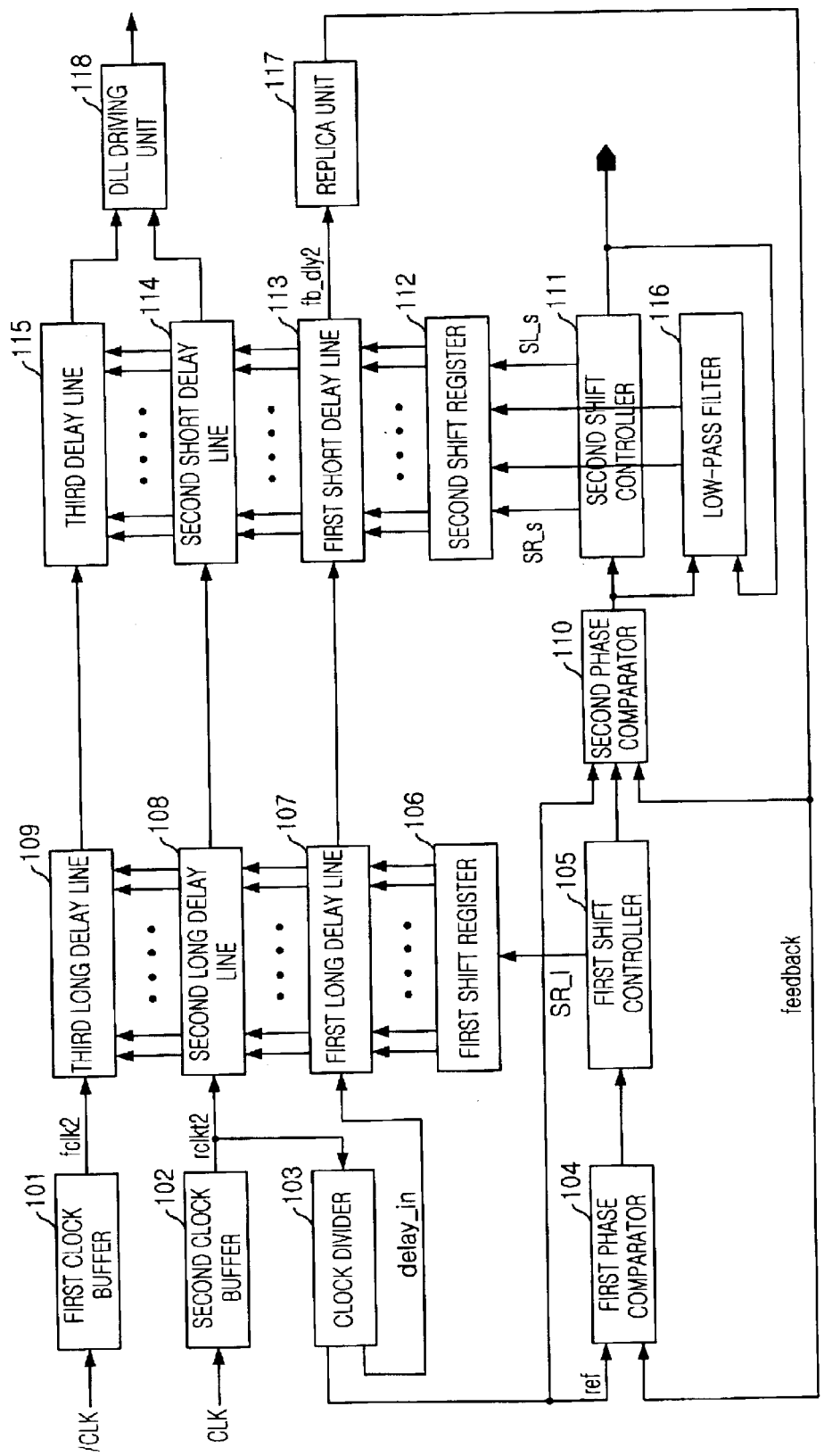
FIG. 1 shows a block diagram of a conventional RDLL circuit.
Figure 2:
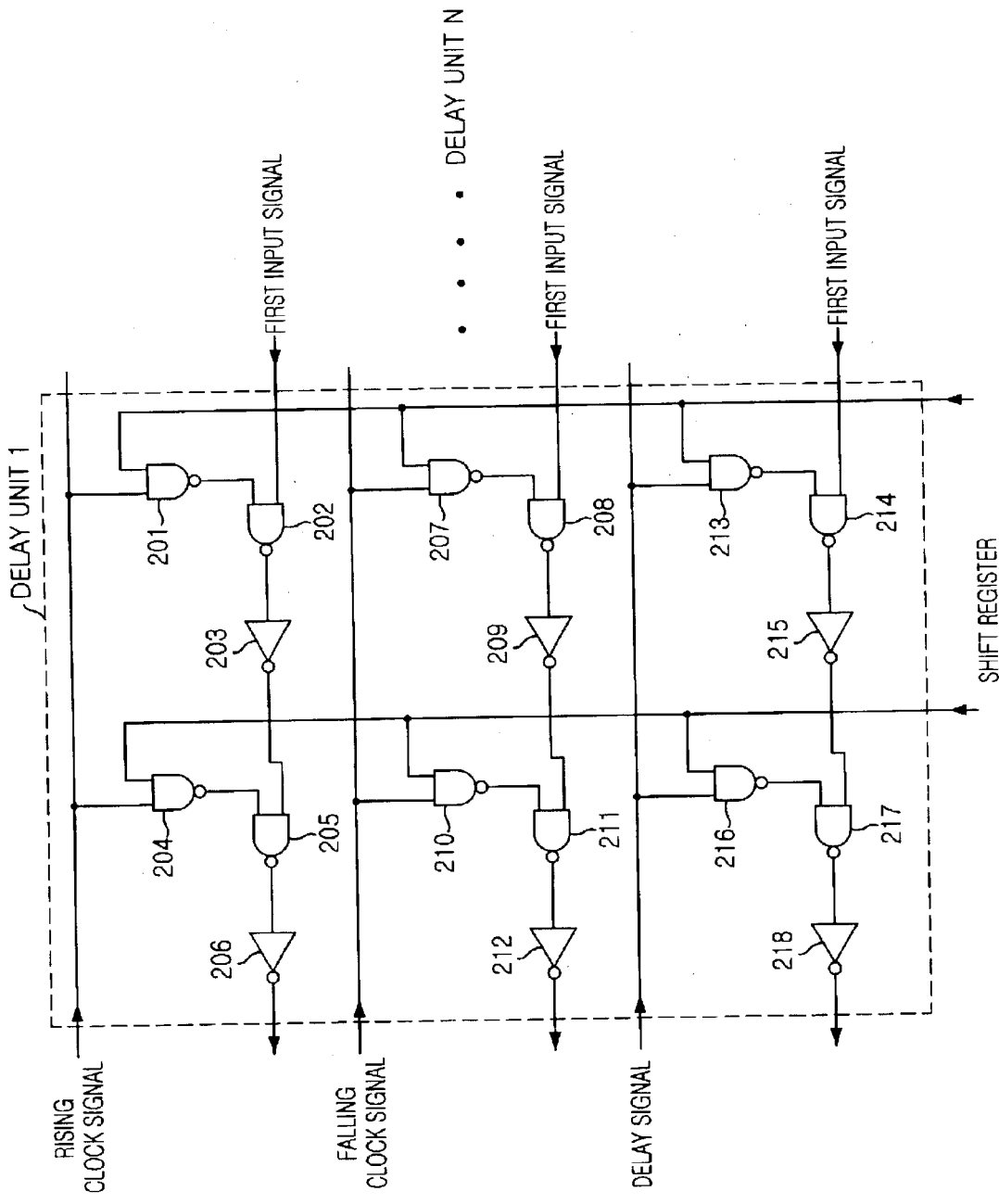
FIG. 2 provides a block diagram of a delay line employed in the conventional RDLL circuit.
Figure 3:
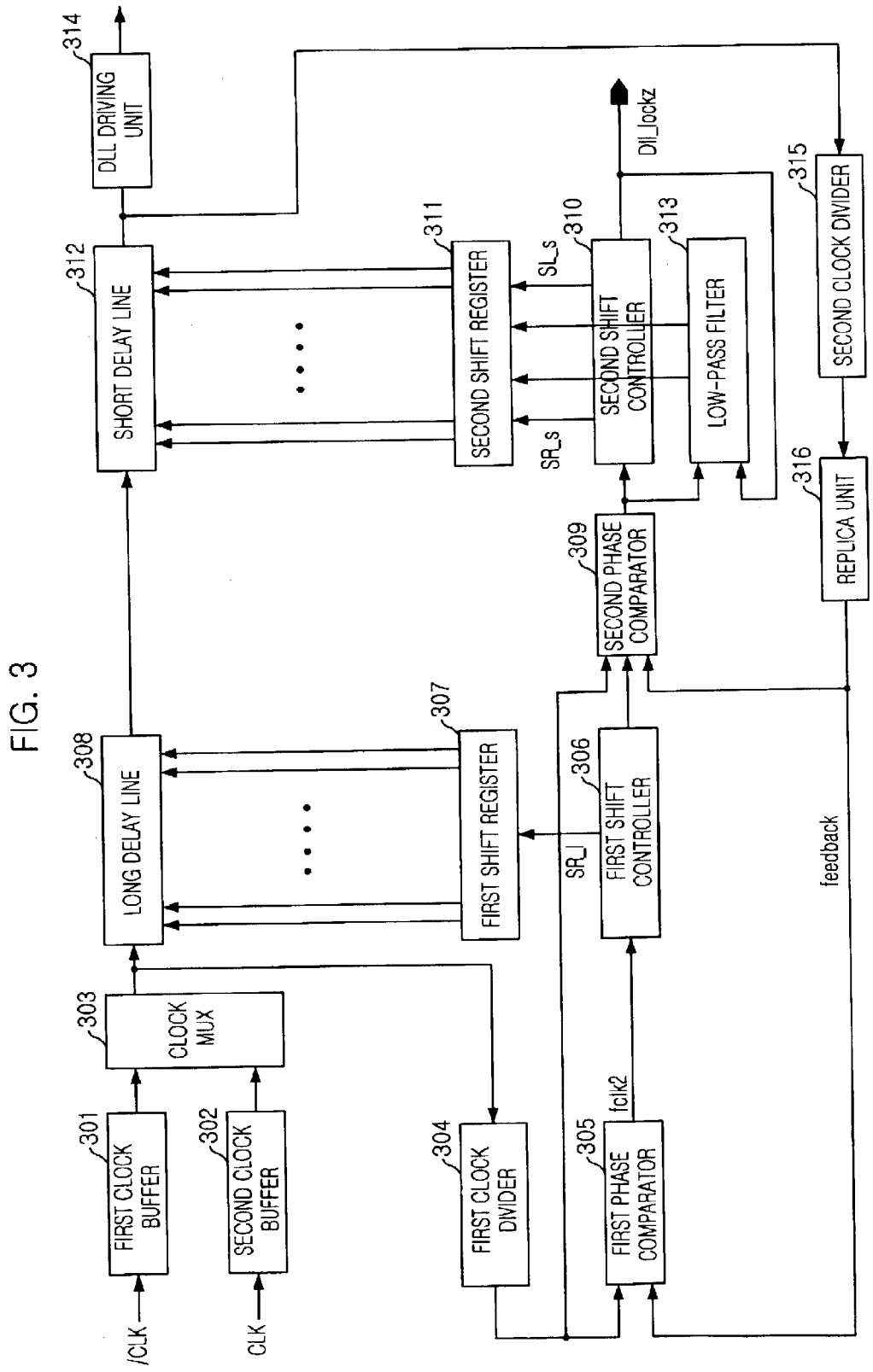
FIG. 3 represents a block diagram of an RDLL circuit in accordance with the present invention.

In FIG. 3, there is provided a block diagram of a RDLL circuit for area reduction in accordance with the present invention.

The RDLL circuit includes a first clock buffer 301, a second clock buffer 302, a clock multiplexer 303, a first clock divider 304, a first phase comparator 305, a first shift controller 306, a first shift register 307, a long delay line 308, a second phase comparator 309, a second shift controller 310, a second shift register 311, a short delay line 312, a low-pass filter 313, a DLL driving unit 314, a second clock divider 315 and a replica unit 316.

The first clock buffer 301 generates a falling clock signal actuated at a falling edge of an inverted external clock signal /CLK and provides the falling clock signal to the clock multiplexer 303.

The second clock buffer 302 produces a rising clock signal activated at a rising edge of an external clock signal CLK and supplies the rising clock signal to the clock multiplexer 303.

The clock multiplexer 303 outputs a single clock signal made by combining the falling clock signal from the first clock buffer 301 and the rising clock signal from the second clock buffer 302 to the long delay line 308 and the first clock divider 304.

The first clock divider 304 produces a pulse per every four clock or every eight clock in response to the signal clock signal and provides the pulse to the first phase comparator 305 and the second phase comparator 309.

Meanwhile, the first phase comparator 305 compares a reference signal ref from the first clock divider 304 and a feedback signal feedback from the replica unit 316 to thereby output a first comparison signal to the firs shift controller 306.

The first shift controller 306 generates a right shift signal SR_1 and a first shift signal based on the first comparison signal from the first phase comparator 305 and provides the right shift signal SR_1 and the first shift signal to the first shift register 307 and the second phase comparator 309, respectively.

The first shift register 307 controls an amount of delay by shifting its output signal to the right based on the right shift signal SR_1 coupled from the first shift controller 306.

The long delay line 308 adjusts an amount of delay in response to an output signal of the first shift register 307 and the single clock signal fed from the clock multiplexer 303.

The second phase comparator 309 compares the reference signal ref coupled from the first clock divider 304, the feedback signal feedback provided from the replica unit 316, and the first shift signal provided from the first shift controller 306 to thereby output a second comparison signal to the second shift controller 310 and the low-pass filter 313.

The second shift controller 310 produces a left shift signal SL_s, a right shift signal SR_s and a delay locked loop locking signal D11_lockz by using the second comparison signal outputted from the second phase comparator 309 and supplies the right shift signal SR_s and the delay locked loop locking signal D11_lockz to the second shift controller 310 and the low-pass filter 313, respectively.

The second shift register 311 adjusts an amount of delay by shifting its output signal to the right or left based on the left shift signal SL_s and the right shift signal SR_s from the second shift controller 310.

The short delay line 312 adjusts an amount of delay in response to the output signal of the second shift register 311 and an output signal of the long delay line 308.

The low-pass filter 313, which is actuated under the control of the delay locked loop locking signal D11_lockz from the second shift controller 310, for counting times of result values outputted from the second phase comparator 309 in response to the second comparison signal coupled from the second phase comparator 309.

The DLL driving unit 314 provides the output signal of the short delay line 312 to an internal circuit.

The second clock divider 315 produces a pulse per every four or eight clock based on the output signal of the short delay line 312 and outputs the pulse to the replica unit 316.

The replica unit 316 compensates a timing difference between the external clock and the internal clock by using a signal whose delay is adjusted from the second clock divider 315, thereby outputting the feedback signal feedback to the first phase comparator 305 and the second phase comparator 306.

Figure 4:
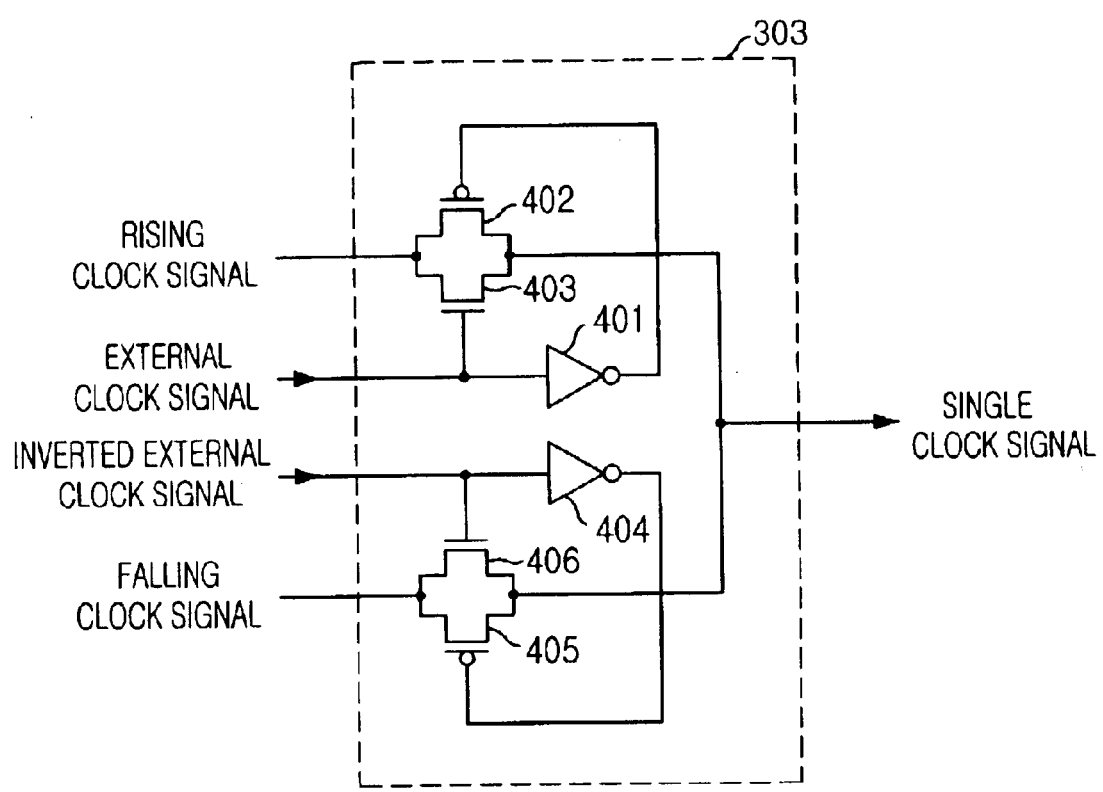
FIG. 4 describes a circuit diagram of a clock multiplexer employed in the RDLL circuit in accordance with the present invention.

In FIG. 4, there is described a circuit diagram of the clock multiplexer 313 employed in the RDLL circuit for area reduction in accordance with the present invention.

The operation of the clock multiplexer 313 will be explained hereinafter.

A first inverter 401 inverts the external clock signal.

A first PMOS transistor 402 has a gate coupled with an output signal of the first inverter 401, a source fed with the falling clock signal and a drain connected to an output terminal of the clock multiplexer 303 outputting the signal clock signal through its output terminal.

In the meantime, a first NMOS transistor 403 includes a gate receiving the external clock signal, a drain connected to the source of the first PMOS transistor 402 and a source attached to the drain of the first PMOS transistor 402.

A second inverter 404 inverts an inverted external clock signal.

A second PMOS transistor 405 employs a gate coupled with an output signal of the second inverter 404, a source provided with the rising clock signal and a drain connected to the output terminal of the clock multiplexer 303.

A second NMOS transistor 406 has a gate receiving the external clock signal, a drain connected to the source of the second PMOS transistor 405 and a source attached to the drain of the second PMOS transistor 405.

Figure 5:
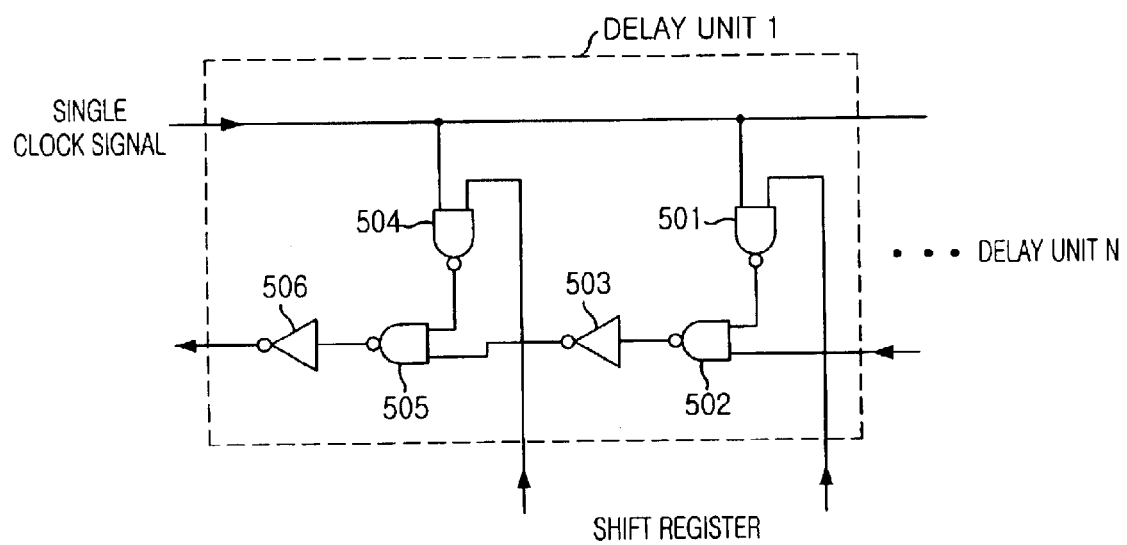
FIG. 5 is a circuit diagram of a delay line employed in the RDLL circuit in accordance with the present invention.

In FIG. 5, there is depicted a circuit diagram of the delay unit included in the RDLL circuit for area reduction in accordance with the present invention.

A first NAND gate 501 performs a NAND operation based on the single clock signal and the output signals of the shift registers 307 and 311.

A second NAND gate 502 executes a NAND operation based on an output signal of the first NAND gate 501 and an output signal of another delay unit.

A first inverter 503 inverts an output signal of the second NAND gate 502.

A third NAND gate 504 carries out a NAND operation based on the single clock signal and the output signals of the shift registers 307 and 311.

A fourth NAND gate 505 accomplishes a NAND operation based on an output signal of the third NAND gate 504 and an output signal of the first inverter 503.

A second inverter 506 inverts an output signal of the fourth NAND gate 505.

The operation of the RDLL circuit in accordance with the present invention is explained as follows.

The first clock buffer 301 and the second clock buffer 302 generate the falling clock signal and the rising clock signal by using the inverted external clock signal and the external clock signal, respectively. The clock signals are delayed and outputted through the delay blocks 308 and 312. The delayed clock signal is outputted as a DLL clock signal after passing through the DLL driving unit 314.

At the same time, the delayed clock signal is transmitted through the replica unit 316 to the phase comparators 305 and 309, which determine that the phase is proceeding or following by performing comparison operation based on the delayed clock signal. According to the comparison result, the shift controllers 306 and 310 adjust an amount of negative delay constantly.

In accordance with the present invention, the number of additional circuits of the delay line block can be reduced. As a result, it is possible to design a portable DLL circuit and to solve the problem of the current consumption due to a lot of delay circuits.

While the present invention has been described with respect to the particular embodiments, it will be apparent to those skilled in the art that various changes and modifications may be made without departing from the spirit and scope of the invention as defined in the following claims.

What is claimed is:

1. A register-controlled delay locked loop (RDLL) circuit for area reduction, comprising:
   a first clock buffer for generating a falling clock signal, which is activated at a rising edge of an inverted external clock signal;
   a second clock buffer for generating a rising clock signal, which is activated at a rising edge of an external clock signal;
   a clock multiplexer for outputting a single clock signal made by combining the falling clock signal and the rising clock signal;
   a delay line for delaying the single clock signal to generate a delayed single clock signal; and
   a control means for controlling the delay line so as to adjust amount of delay of the single clock signal.

2. The RDLL circuit as recited in claim 1, wherein the delay line includes:
   a long delay line for delaying the single clock signal outputted from the clock multiplexer; and
   a short delay line for delaying an output signal of the long delay line.

3. The RDLL circuit as recited in claim 2, wherein the control means includes:
   a first clock divider for producing a pulse per every four clock or every eight clock in response to the single clock signal;
   a first control unit for controlling the long delay line by receiving a reference signal outputted from the first clock divider and a feed back signal;
   a second control unit for controlling the short delay line by receiving the reference signal, the feed back signal and an output signal of the first control unit;
   a second clock divider for producing a pulse per every four or eight clock based on the output signal of the short delay line; and
   a replica unit for compensating a timing difference between the external clock and the internal clock by using a signal whose delay is adjusted from the second clock divider, thereby outputting the feedback signal.

4. The RDLL circuit as recited in claim 3, wherein the first control means includes:
   a first phase comparator for comparing a reference signal and the feedback signal to thereby output a first comparison signal;
   a first shift controller for generating a right shift signal and a first shift signal based on the first comparison signal; and
   a first shift register for controlling an amount of delay of the long delay line by shifting its output signal to the right based on the right shift signal.

5. The RDLL circuit as recited in claim 4, wherein the second control means includes:
   a second phase comparator for comparing the feedback signal, the reference signal provided by the first clock divider and the first shift signal to thereby output a second comparison signal;
   a second shift controller for producing a left shift signal, a right shift signal and a delay locked loop locking signal by using the second comparison signal outputted from the second phase comparator; and
   a second shift register for adjusting an amount of delay of the short delay line by shifting its output signal to the right or left based on the left shift signal and the right shift signal from the second shift controller.

6. The RDLL circuit as recited in claim 5, further comprising:
   a low-pass filter, which is actuated by the delay locked loop locking signal from the second shift controller, for counting times of result values outputted from the second phase comparator in response to the second comparison signal; and
   a delay locked loop driving means for providing the output signal from the short delay line to an internal circuit.

7. The RDLL circuit as recited in claim 1, wherein the clock multiplexer includes:
   a first inverter for inverting an external clock signal to thereby output an inverted external clock signal;
   a first PMOS transistor having a gate coupled with an output signal of the first inverter, a source fed with the falling clock signal and a drain connected to an output terminal through which the single clock signal is outputted;
   a first NMOS transistor having a gate receiving the external clock signal, a drain connected to the source of the first PMOS transistor and a source attached to the drain of the first PMOS transistor;
   a second inverter for inverting an inverted external clock signal;
   a second PMOS transistor having a gate coupled with an output signal of the second inverter, a source provided with the rising clock signal and a drain connected to the output terminal; and
   a second NMOS transistor having a gate receiving the external clock signal, a drain connected to the source of the second PMOS transistor and a source attached to the drain of the second PMOS transistor.

8. The RDLL circuit for area reduction as recited in claim 2, wherein the long delay line includes a plurality of delay units, each delay unit containing:
   a first NAND gate for performing a NAND operation based on the single clock signal and the output signal of the first shift register;
   a second NAND gate for executing a NAND operation based on an output signal of the first NAND gate and an output signal of another delay unit;
   a first inverter for inverting an output signal of the second NAND gate;
   a third NAND gate for carrying out a NAND operation based on the single clock signal and the output signal of the first shift register;
   a fourth NAND gate for accomplishing a NAND operation based on an output signal of the third NAND gate and an output signal of the first inverter; and
   a second inverter for inverting an output signal of the fourth NAND gate.

9. The RDLL circuit for area reduction as recited in claim 2, wherein the short delay line includes a multiplicity of delay units, each delay unit containing:
   a first NAND gate for performing a NAND operation based on an output signal of the long delay line and the output signal of the second shift register;
   a second NAND gate for executing a NAND operation based on an output signal of the first NAND gate and an output signal of another delay unit;
   a first inverter for inverting an output signal of the second NAND gate;
   a third NAND gate for carrying out a NAND operation based on the output signal of the long delay line and the output signal of the second shift register;
   a fourth NAND gate for accomplishing a NAND operation based on an output signal of the third NAND gate and an output signal of the first inverter; and
   a second inverter for inverting an output signal of the fourth NAND gate.

10. A double data rate synchronous dynamic random access memory (DDR SDRAM) having a register-controlled delay locked loop (RDLL) for area reduction, the RDLL comprising:
    a first clock buffer for generating a falling clock signal, which is activated at a rising edge of an inverted external clock signal;
    a second clock buffer for generating a rising clock signal, which is activated at a rising edge of an external clock signal;

a clock multiplexer for outputting a single clock signal made by combining the falling clock signal and the rising clock signal;

a delay line for delaying the single clock signal to generate a delayed single clock signal; and a control means for controlling the delay line so as to adjust amount of delay of the single clock signal.

11. The DDR SDRAM as recited in claim 10, wherein the clock multiplexer includes:

a first inverter for inverting an external clock signal to thereby output an inverted external clock signal;

a first PMOS transistor having a gate coupled with an output signal of the first inverter, a source fed with the falling clock signal and a drain connected to an output terminal through which the single clock signal is outputted;

a first NMOS transistor having a gate receiving the external clock signal, a drain connected to the source of the first PMOS transistor and a source attached to the drain of the first PMOS transistor;

a second inverter for inverting an inverted external clock signal;

a second PMOS transistor having a gate coupled with an output signal of the second inverter, a source provided with the rising clock signal and a drain connected to the output terminal; and a second NMOS transistor having a gate receiving the external clock signal, a drain connected to the source of the second PMOS transistor and a source attached to the drain of the second PMOS transistor.

* * * * *